US008465593B2

(12) United States Patent
Hayashi et al.

(10) Patent No.: US 8,465,593 B2
(45) Date of Patent: Jun. 18, 2013

(54) SUBSTRATE PROCESSING APPARATUS AND GAS SUPPLY METHOD

(75) Inventors: Daisuke Hayashi, Nirasaki (JP); Morihiro Takanashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 990 days.

(21) Appl. No.: 12/014,537

(22) Filed: Jan. 15, 2008

(65) Prior Publication Data

US 2008/0182423 A1 Jul. 31, 2008

Related U.S. Application Data

(60) Provisional application No. 60/896,507, filed on Mar. 23, 2007.

(30) Foreign Application Priority Data

Jan. 30, 2007 (JP) ................................ 2007-019889

(51) Int. Cl.
| | |
|---|---|
| C23C 16/448 | (2006.01) |
| C23C 16/455 | (2006.01) |
| C23C 16/52 | (2006.01) |
| C23F 1/00 | (2006.01) |
| H01L 21/306 | (2006.01) |
| C23C 16/06 | (2006.01) |

(52) U.S. Cl.
USPC ..... 118/726; 118/666; 118/696; 118/723 VE; 156/345.26; 156/345.24; 156/345.27; 156/345.29

(58) Field of Classification Search
USPC ....... 118/726, 666, 696, 723 VE; 156/345.24, 156/345.26, 345.27, 345.29
See application file for complete search history.

(56) References Cited

U.S. PATENT DOCUMENTS

| | | | | |
|---|---|---|---|---|
| 3,652,331 | A | * | 3/1972 | Yamazaki ............... 427/255.394 |
| 4,508,054 | A | * | 4/1985 | Baumberger et al. ......... 118/718 |
| 5,174,855 | A | * | 12/1992 | Tanaka ............................ 216/99 |
| 5,595,606 | A | * | 1/1997 | Fujikawa et al. ............. 118/725 |
| 5,616,208 | A | * | 4/1997 | Lee .......................... 156/345.24 |
| 5,647,945 | A | * | 7/1997 | Matsuse et al. .......... 156/345.38 |
| 5,785,796 | A | * | 7/1998 | Lee .......................... 156/345.24 |
| 5,951,772 | A | * | 9/1999 | Matsuse et al. ........... 118/723 R |
| 6,269,221 | B1 | * | 7/2001 | Horie et al. .................... 392/399 |
| 6,942,753 | B2 | * | 9/2005 | Choi et al. ............... 156/345.34 |
| 2005/0223986 | A1 | * | 10/2005 | Choi et al. ..................... 118/715 |
| 2005/0251990 | A1 | * | 11/2005 | Choi et al. ....................... 29/558 |
| 2005/0255257 | A1 | * | 11/2005 | Choi et al. .................... 427/585 |

FOREIGN PATENT DOCUMENTS

| | | |
|---|---|---|
| JP | 5-102083 | 4/1993 |
| JP | 7-94488 | 4/1995 |
| JP | 2002-299330 | 10/2002 |
| JP | 2006-245214 | 9/2006 |
| JP | 2006-280461 | 10/2006 |

OTHER PUBLICATIONS

Office Action issued May 11, 2011 in Japanese Patent Application No. 2007-019889 (with partial English translation).

* cited by examiner

*Primary Examiner* — Rudy Zervigon
(74) *Attorney, Agent, or Firm* — Oblon, Spivak, McClelland, Maier & Neustadt, L.L.P.

(57) ABSTRACT

A substrate processing apparatus that can prevent formation of deposit in openings of a plurality of gas supply holes leading into a processing chamber. Each of the gas supply holes is configured to uniformly supply a processing gas, whose molecules are turned into clusters, into the processing chamber and to prevent liquefaction of processing gas when the processing gas is supplied into the processing chamber.

6 Claims, 5 Drawing Sheets

SUBSTRATE PROCESSING APPARATUS AND GAS SUPPLY METHOD

BACKGROUND OF THE INVENTION

1. Field of the Invention

The present invention relates to a substrate processing apparatus and a gas supply method, and in particular to a substrate processing apparatus having a gas supply unit that supplies hydrogen fluoride gas into a processing chamber.

2. Description of the Related Art

In a semiconductor device manufacturing method of manufacturing semiconductor devices from silicon wafers (hereinafter referred to as "wafers"), a film formation process such as CVD (chemical vapor deposition) in which a conductive film or an insulating film is formed on a surface of a wafer, a lithography process in which a photoresist layer with a desired pattern is formed on the formed conductive film or insulating film, and an etching process in which a conductive film is formed into a gate electrode through plasma produced from a processing gas using the photoresist layer as a mask, or wiring trenches and contact holes are formed in the insulating film are repeatedly carried out in sequence.

For example, in a certain semiconductor device manufacturing method, there may be a case where a polysilicon layer formed on a wafer is etched using a hard mask formed with a predetermined pattern. In this case, a deposit film comprised of SiOBr is formed on a side of a trench formed through etching. It should be noted that SiOBr has a similar property to $SiO_2$.

Meanwhile, the deposit film may cause defects of a semiconductor device, such as a conduction failure, and hence have to be removed. Moreover, to increase throughput, it is preferred that the deposit film and the hard mask formed on the wafer are removed at the same time.

Conventionally, as a method of removing a deposit film and a hard mask at the same time, there has been known a substrate processing method in which a chemical reaction process using hydrogen fluoride gas and a heating process are carried out on a wafer. Also, as a substrate processing apparatus that carries out the substrate processing method involving the chemical reaction process and the heating process, there has been known a substrate processing apparatus that has a chemical reaction processing device and a heating processing device connected to the chemical reaction processing device (see, for example, the specification of Japanese Patent Application No. 2006-280461).

In general, the chemical reaction processing device has a processing chamber that houses a wafer, a gas supply unit that supplies a processing gas into the processing chamber, and a mounting stage on which the wafer is mounted, wherein the gas supply unit is disposed to face the wafer mounted on the mounting stage and has a number of small-diameter gas supply holes dispersed on a surface facing the wafer. The gas supply unit supplies a processing gas into the processing chamber from an area of a higher pressure than the pressure in the processing chamber so as to function as a GDP (gas distribution plate) that discharges the processing gas uniformly toward the wafer.

In general, when gas is discharged in a stroke from a high-pressure area to a low-pressure area, there may be a case where the temperature of the gas decreases due to adiabatic expansion, causing the gas to liquefy. For this reason, considering the above temperature decrease caused by adiabatic expansion, a processing gas to be supplied into the processing chamber of the chemical reaction processing device is usually heated to a predetermined temperature in advance, and hence even when the processing gas is discharged in a stroke from a high-pressure area to a low-pressure area, the processing gas can be maintained in gaseous form.

However, when supplied at a high pressure and at a low temperature, the hydrogen fluoride gas lies in a high polymer state due to clustering of hydrogen fluoride molecules, i.e. chain combination of the hydrogen fluoride molecules. When the hydrogen fluoride gas is discharged in a stroke from a high-pressure area to a low-pressure area, the temperature of the hydrogen fluoride gas suddenly decreases due to dissociation of the clustered hydrogen fluoride molecules as well as adiabatic expansion, and hence the hydrogen fluoride gas cannot be maintained in gaseous form. Specifically, the temperature of the hydrogen fluoride gas becomes lower than a boiling point in the vicinity of openings of the gas supply holes leading into the processing chamber, and the hydrogen fluoride gas thus liquefies in the vicinity of the openings. The liquefied hydrogen fluoride is turned into deposit in the vicinity of the openings, and the deposit obstructs the discharge of hydrogen fluoride gas. As a result, hydrogen fluoride gas cannot be discharged uniformly toward a wafer, and this affects processing carried out on the wafer. Further, if the deposit is caused to fall off by the discharge of hydrogen fluoride gas, and the deposit caused to fall off becomes attached to the surface of a wafer, this may cause defects of a semiconductor device ultimately manufactured.

SUMMARY OF THE INVENTION

The present invention provides a substrate processing apparatus and a gas supply method that can prevent formation of deposit in openings of gas supply holes leading into a processing chamber.

Accordingly, in a first aspect of the present invention, there is provided a substrate processing apparatus comprising a gas supply unit that supplies a processing gas into a processing chamber, wherein the gas supply unit comprises a plurality of gas supply holes, each of the gas supply holes is configured to uniformly supply the processing gas into the processing chamber and prevent liquefaction of the processing gas when the gas supply unit supplies the processing gas into the processing chamber, and molecules of the processing gas are turned into clusters.

According to the first aspect of the present invention, since a processing gas whose molecules are turned into clusters is uniformly supplied into the processing chamber through the plurality of gas supply holes, and the processing gas is prevented from liquefying, formation of deposit caused by liquefaction of the processing gas in the vicinity of the openings of the gas supply holes leading into the processing chamber can be prevented.

The present invention can provide a substrate processing apparatus, wherein in a case where a flow rate of the processing gas supplied into the processing chamber by the gas supply unit is 2970 to 3030 sccm, the gas supply holes are formed to have a diameter of 1 mm or greater.

According to the first aspect of the present invention, in a case where the flow rate of a processing gas supplied into the processing chamber by the gas supply unit is 2970 to 3030 sccm, the gas supply holes are formed to have a diameter of 1 mm or greater. Therefore, cooling caused by adiabatic expansion at the time of supply of a processing gas into the processing chamber and dissociation cooling at the time of dissociation of the processing gas turned into clusters can be suppressed, and hence a decrease in the temperature of the processing gas can be kept within a predetermined range. As a result, liquefaction of the processing gas in the vicinity of the openings of the gas supply holes leading into the processing chamber can be reliably prevented.

The present invention can provide a substrate processing apparatus, wherein a pressure in the processing chamber is 4000 Pa (30 Torr) or higher, and a temperature on walls of the gas supply holes is 80° C. or higher.

According to the first aspect of the present invention, the pressure in the processing chamber is 4000 Pa (30 Torr) or higher, and the temperature on walls of the gas supply holes is 80° C. or higher. Therefore, cooling caused by adiabatic expansion at the time of supply of the processing gas into the processing chamber and dissociation cooling at the time of dissociation of a processing gas turned into clusters can be reliably suppressed, and hence a decrease in the temperature of the processing gas can be reliably kept within a predetermined range.

The present invention can provide a substrate processing apparatus, wherein each of the gas supply holes has an opening leading into the processing chamber and broadening toward the end.

According to the first aspect of the present invention, each of the gas supply holes has an opening leading into the processing chamber and broadening toward the end. As a result, a processing gas can be efficiently diffused into the processing chamber, and residues and the like produced in the processing chamber can be prevented from flowing backward into the gas supply holes.

The present invention can provide a substrate processing apparatus, wherein the gas supply unit comprises a pressure-reducing and heating unit that reduces a pressure of the processing gas and heats the processing gas before supplying the processing gas into the processing chamber.

According to the first aspect of the present invention, before a processing gas is supplied into the processing chamber, the pressure of the processing gas is reduced, and the processing gas is heated. Therefore, before a processing gas is supplied into the processing chamber, molecules of the processing gas turned into clusters can be dissociated. As a result, the average molecular weight of the processing gas turned into clusters can be reduced, and hence a temperature decrease caused by dissociation at the time of the supply of the processing gas into the processing chamber can be reduced.

The present invention can provide a substrate processing apparatus, wherein the processing gas comprises hydrogen fluoride gas.

According to the first aspect of the present invention, the processing gas is hydrogen fluoride gas. As a result, a deposit film and a hard mask formed on a substrate in the processing chamber can be removed at the same time.

Accordingly, in a second aspect of the present invention, there is provided a gas supply method for a substrate processing apparatus comprising a gas supply unit that has a plurality of gas supply holes and uniformly supplies a processing gas, whose molecules are turned into clusters, into a processing chamber, the method comprising a supply step of supplying the processing gas without causing the processing gas to liquefy.

The present invention can provide a gas supply method, wherein in the supply step, the processing gas is supplied while preventing a temperature of the processing gas from decreasing by 53° C. or more when the processing gas passes through the gas supply holes in a case where the processing gas is supplied at a flow rate of 2970 to 3030 sccm into the processing chamber.

According to the second aspect of the present invention, in a case where a processing gas is supplied at a flow rate of 2970 to 3030 sccm into the processing chamber, the processing gas is supplied while preventing the temperature of the processing gas from decreasing by 53° C. or more when the processing gas passes through the gas supply holes. As a result, liquefaction of the processing gas in the vicinity of the openings of the gas supply holes into the processing chamber can be reliably prevented.

The present invention can provide a gas supply method, wherein a pressure in the processing chamber is 4000 Pa (30 Torr) or higher, and a temperature on walls of the gas supply holes is 80° C. or higher.

The present invention can provide a gas supply method, further comprising a pressure-reducing and heating step of reducing a pressure of the processing gas and heating the processing gas before supplying the processing gas into the processing chamber.

The present invention can provide a gas supply method, wherein the processing gas comprises hydrogen fluoride gas.

The features and advantages of the invention will become more apparent from the following detailed description taken in conjunction with the accompanying drawings.

BRIEF DESCRIPTION OF THE DRAWINGS

FIGS. 2A and 2B are sectional views showing a second process module appearing in FIG. 1, in which

DETAILED DESCRIPTION OF THE PREFERRED EMBODIMENTS

The present invention will now be described in detail below with reference to the drawings showing a preferred embodiment thereof.

First, a description will be given of a substrate processing system including a substrate processing apparatus according to an embodiment of the present invention.

Figure 1:
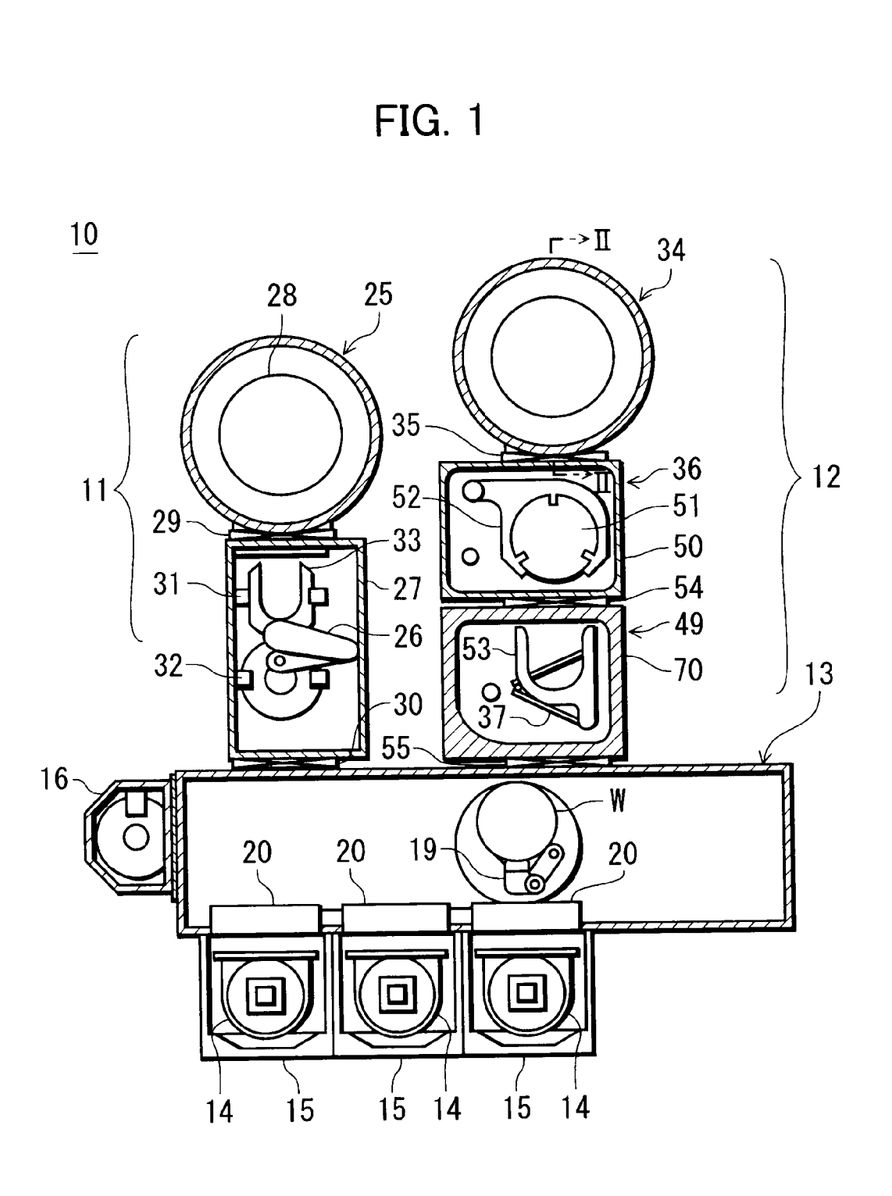
FIG. 1 is a plan view schematically showing the construction of a substrate processing system including a substrate processing apparatus according to an embodiment of the present invention.

FIG. 1 is a plan view schematically showing the construction of the substrate processing system including the substrate processing apparatus according to the embodiment.

As shown in FIG. 1, the substrate processing system 10 is comprised of a first process ship 11 that subjects semiconductor device wafers (hereinafter referred to merely as "wafers") W to plasma processing, a second process ship 12 that is disposed parallel to the first process ship 11 and subjects each wafer W to a chemical reaction process and a heating process, and a loader module 13 as a common transfer chamber having a rectangular shape to which the first process ship 11 and the second process ship 12 are connected.

Three FOUP (Front Opening Unified Pod) mounting stages 15 on which respective FOUPs 14 as containers each housing 25 wafers W, and an orienter 16 that carries out pre-alignment of the wafers W transferred out from the FOUPs 14, as well as the first process ship 11 and the second process ship 12 described above are connected to the loader module 13.

The first process ship 11 and the second process ship 12 are connected to a side wall of the loader module 13 in the longitudinal direction thereof and disposed across the loader module 13 from the three FOUP mounting stages 15. The orienter 16 is disposed at one end of the loader module 13 in the longitudinal direction thereof.

The loader module 13 has therein a transfer arm mechanism 19 of a SCARA dual arm type for transferring the wafers W, and three load ports 20 that are openings for receiving the wafers W and disposed on a side wall of the loader module 13 in such a manner as to correspond to the respective FOUP mounting stages 15. The transfer arm mechanism 19 removes each wafer W from the FOUPs 14 mounted on the FOUP mounting stages 15 via the load ports 20 and transfers the removed wafer W into the first process ship 11, the second process ship 12, or the orienter 16.

The first process ship 11 has a first process module 25 that subjects the wafers W to plasma processing, and a first load-lock module 27 that incorporates a first link-type single-pick transfer arm 26 that transfers each wafer W into the first process module 25.

The first process module 25 has a cylindrical chamber, and an upper electrode and a lower electrode disposed inside the chamber (all of them are not shown), and the distance between the upper electrode and the lower electrode is set to an appropriate value so that each wafer W can be subjected to etching processing as the plasma processing. The lower electrode has at the top thereof an ESC (electrostatic chuck) 28 that chucks each wafer W through a Coulomb force or the like.

In the first process module 25, a processing gas is introduced into the chamber and an electric field is generated between the upper electrode and the lower electrode, whereby the introduced processing gas is turned into plasma so as to produce ions and radicals. The wafer W is subjected to the etching processing by the ions and radicals.

In the first process ship 11, the interior of the loader module 13 is always maintained at atmospheric pressure, while the interior of the first process module 25 is maintained under vacuum. For this reason, the first load-lock module 27 has a vacuum gate valve 29 at a link to the first process module 25, and an atmospheric gate valve 30 at a link to the loader module 13, so that the first load-lock module 27 functions as a vacuum preliminary transfer chamber capable of adjusting the internal pressure thereof.

In the interior of the first load-lock module 27, the first transfer arm 26 is disposed in substantially the central part, a first buffer 31 is disposed on the first process module 25 side with respect to the first transfer arm 26, and a second buffer 32 is disposed on the loader module 13 side with respect to the transfer arm 26. The first buffer 31 and the second buffer 32 are disposed on a path on which a supporting section (pick) 33 supporting a wafer W disposed at a distal end of the first transfer arm 26 moves, and a wafer W having been subjected to the plasma processing is temporarily set aside above the path of the supporting section 33, so that a wafer W having not been etched and a wafer W having been already etched can be smoothly replaced with each other in the first process module 25.

The second process ship 12 has a second process module 34 (substrate processing apparatus) that subjects wafers W to the chemical reaction process, described later, a third process module 36 that is connected to the second process module 34 via a vacuum gate valve 35 and subjects the wafers W to the heating process, described later, and a second load-lock module 49 that incorporates a second link-type single-pick transfer arm 37 for transferring the wafers W into the second process module 34 and the third process module 36.

Figure 2A:
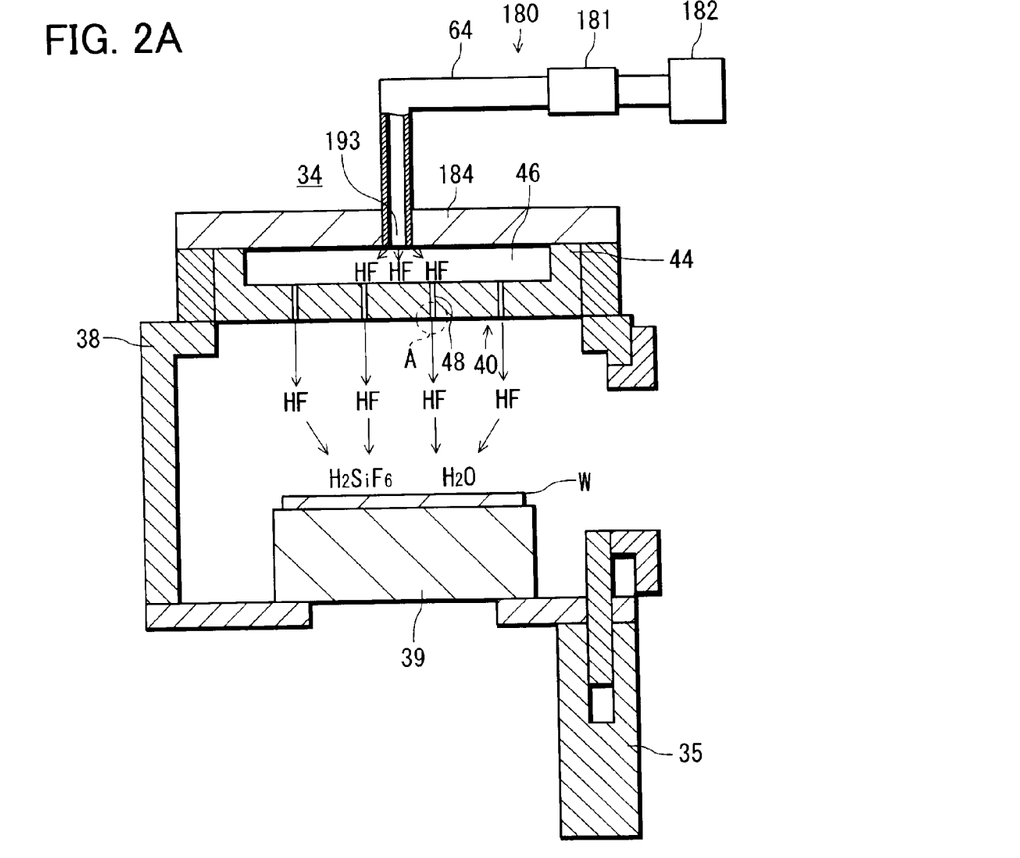
FIG. 2A is a sectional view taken along line II-II of FIG. 1.
Figure 2B:
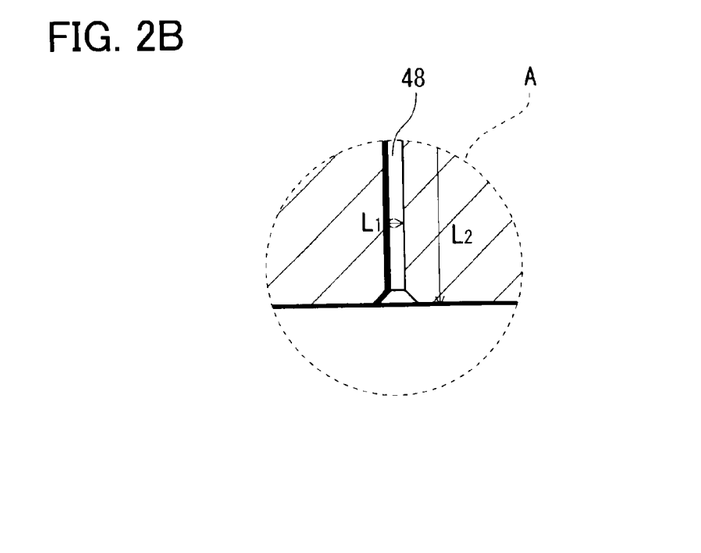
FIG. 2B is an enlarged view showing an area A of FIG. 2A.

FIGS. 2A and 2B are sectional views showing the second process module 34 appearing in FIG. 1, in which FIG. 2A is a sectional view taken along line II-II of FIG. 1, and FIG. 2B is an enlarged view showing an area A of FIG. 2A.

As shown in FIG. 2A, the second process module 34 has a cylindrical processing chamber 38, a cooling stage 39 as a mounting stage disposed inside the chamber 38 and on which a wafer W is mounted, a GDP (gas distribution plate) 40 disposed above the chamber 38 and facing the cooling stage 39, and a second process module exhaust system (not shown) that exhausts gas or the like from the chamber 38.

The cooling stage 39 has a coolant chamber (not shown) as a temperature control mechanism. A coolant, for example cooling water or a Galden (registered trademark) fluid, at a predetermined temperature is circulated through the coolant chamber, and a wafer W mounted on an upper surface of the cooling stage 39 is controlled through the temperature of the coolant.

Moreover, the cooling stage 39 has a plurality of pusher pins (not shown) that can be made to project out from the upper surface of the cooling stage 39. The pusher pins are housed inside the cooling stage 39 when a wafer W is to be mounted on the cooling stage 39, and are made to project out from the upper surface of the cooing stage 39 so as to lift the wafer W up when the wafer W is to be transferred out from the chamber 38 after having been subjected to the chemical reaction process, described later.

The GDP 40 has a gas supply unit 44, which has a buffer chamber 46 and a plurality of gas supply holes 48. The buffer chamber 46 communicates with the chamber 38 via the gas supply holes 48.

Also, the second process module 34 has a hydrogen fluoride gas supply system 180.

The hydrogen fluoride gas supply system 180 has a hydrogen fluoride gas supply unit 182, a hydrogen fluoride gas supply pipe 64 connected to the hydrogen fluoride gas supply unit 182, and a pressure reducing/heating unit 181 provided part way along the hydrogen gas supply pipe 64. The hydrogen fluoride gas supply pipe 64 has a hydrogen fluoride gas supply hole 193 opening into the buffer 46 of the gas supply unit 44 in a ceiling portion 184 of the chamber 38.

Meanwhile, in a certain semiconductor manufacturing method, there may be a case where a polysilicon layer is etched using a hard mask formed with a predetermined pattern on a wafer W. In this case, a deposit film comprised of an SiOBr layer is formed on a side of a trench formed through etching. To increase throughput, it is preferred that the deposit film and the hard mask formed on the wafer W are removed at the same time.

In the present embodiment, in the second process module 34, a wafer W is subjected to the chemical reaction process using hydrogen fluoride gas as a processing gas, and in the third process module 36, the wafer W is subjected to the heating process, whereby a deposit film and a hard mask described above are removed at the same time. It should be noted that the hard mask can be removed using hydrogen fluoride. Specifically, the following chemical reaction is used in the present embodiment:

(Chemical Reaction Process)

$$SiO_2 + 6HF \rightarrow H_2SiF_6 + 2H_2O$$

(Heating Process)

$$H_2SiF_6 \rightarrow SiF_4\uparrow + 2HF\uparrow$$

$$H_2O \rightarrow 4H_2O\uparrow$$

During the chemical reaction process, the cooling stage 39 is maintained at a temperature of 10 to 40° C.

When subjecting a wafer W to the chemical reaction process in the second process module 34, hydrogen fluoride (HF) gas having been pressure-reduced and heated by the pressure-reducing/heating unit 181 is supplied into the buffer 46 from the hydrogen fluoride gas supply pipe 64 and then supplied into the chamber 38 via the gas supply holes 48 as shown in FIG. 2A. Specifically, the pressure of hydrogen fluoride gas supplied at a high pressure (for example, 1000 Torr (+30 kPa)) and at a high temperature (for example, 40° C.) from the hydrogen fluoride gas supply unit 182 is reduced to a predetermined pressure, for example 400 Torr by the pressure-reducing/heating unit 181, and the hydrogen fluoride gas whose temperature has been suddenly decreased due to adiabatic expansion and dissociation of clustered hydrogen fluoride molecules during the pressure reduction is heated again to a high temperature (for example, 40° C.) by the pressure-reducing/heating unit 181 and supplied into the buffer chamber 46. As a result, the hydrogen fluoride molecules in the hydrogen fluoride gas are brought from a high polymer state due to clustering, i.e. a state in which the average molecular weight is approximately 40 into a state in which the average molecular weigh is approximately 25 due to dissociation. Moreover, because the hydrogen fluoride gas is supplied into the chamber 38 from a high-pressure area higher in pressure than the pressure (for example, 4000 Pa (30 Torr)) in the chamber 38, the GDP 40 can discharge the hydrogen fluoride gas uniformly toward the wafer W using a pressure difference.

Moreover, in the GDP 40, the diameter $L_1$ of each gas supply hole 48 is set to 1 mm or greater, preferably, 1 mm. For this reason, liquefaction of the hydrogen fluoride gas in the vicinity of openings of the gas supply holes 48 leading into the chamber 38 is prevented as will be described later in detail. It should be noted that the length $L_2$ of each gas supply holes 48 is set to 10 mm. Further, in the GDP 40, the opening of each gas supply hole 48 leading into the chamber 38 is formed to widen toward the end as shown in FIG. 2B. For this reason, the hydrogen fluoride gas can be efficiently diffused into the chamber 38, and residues or the like produced in the chamber 38 can be prevented from flowing backward into the gas supply holes 48, and by extension, into the buffer chamber 46.

Moreover, the GDP 40 has a heater (not shown) such as a heating element incorporated therein. The heating element controls the temperature of the hydrogen fluoride gas in the buffer chamber 46. The walls of the gas supply holes 48 are heated to a temperature of 80° C. or higher by the heating element.

In the second process module 34, the wafer W is subjected to the chemical reaction process by adjusting the pressure in the chamber 38 and the flow rate of the hydrogen fluoride gas supplied into the chamber 38. Specifically, the pressure in the chamber 38 is set to 4000 Pa (30 Torr) or higher, and the flow rate of the hydrogen fluoride gas is set to 2970 to 3030 sccm.

Figure 3:
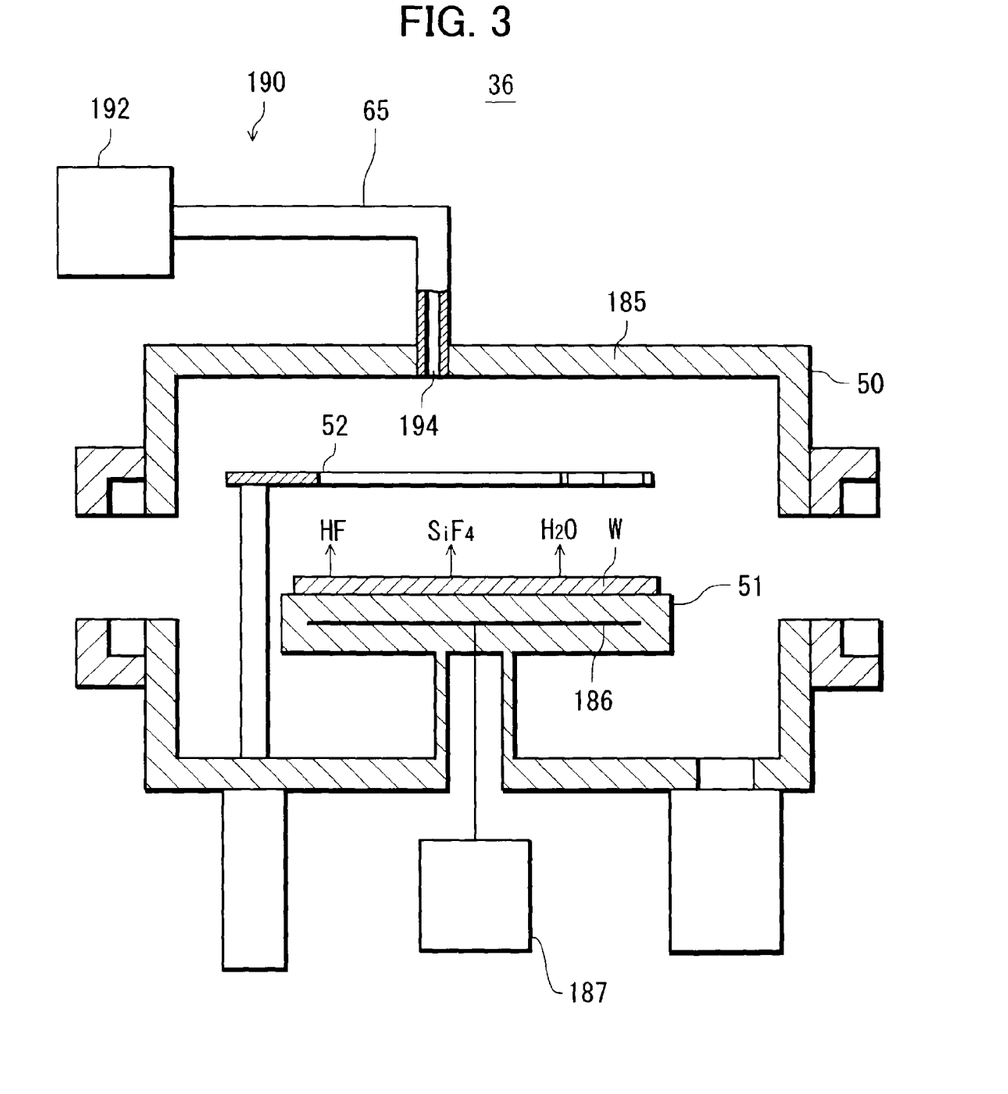
FIG. 3 is a sectional view showing a third process module appearing in FIG. 1.

FIG. 3 is a sectional view showing the third process module 36 appearing in FIG. 1.

As shown in FIG. 3, the third process module 36 has a box-shaped chamber 50, a heating stage 51 as a mounting stage disposed inside the chamber 50 to face a ceiling portion 185 of the chamber 50 and on which a wafer W is mounted, and a buffer arm 52 that is disposed in the vicinity of the heating stage 51 and lifts up the wafer W mounted on the heating stage 51.

The heating stage 51 is made of aluminum on the surface of which an oxide film is formed and heats the mounted wafer W to a predetermined temperature using a built-in heater 186 comprised of an electrically-heated wire and the like. Specifically, the heating stage 51 directly heats the mounted wafer W to a temperature of 175 to 300° C. It should be noted that the heating value of the heater 186 is controlled by a heater controller 187.

The buffer arm 52 temporarily sets aside a wafer W having been subjected to the chemical reaction process to above the path of a supporting section 53 of the second transfer arm 37, so that wafers W can be smoothly replaced in the second process module 34 and the third process module 36.

Also, the third process module 36 has a nitrogen gas supply system 190.

The nitrogen gas supply system 190 has a nitrogen gas supply unit 192, and a nitrogen gas supply pipe 65 connected to the nitrogen gas supply unit 192. The nitrogen gas supply pipe 65 has a nitrogen gas supply hole 194 that is opened in the ceiling portion 185 of the chamber 50 so as to face a wafer W mounted on the heating stage 51. The nitrogen gas supply unit 192 supplies nitrogen ($N_2$) gas as a purge gas into the chamber 50 via the nitrogen gas supply pipe 65 and the nitrogen gas supply hole 194 and exhausts gas produced (volatilized) in the above described heating process. Moreover, the nitrogen gas supply unit 192 adjusts the flow rate of nitrogen gas to be supplied.

In the third process module 36, a wafer W is subjected to the above described heating process by controlling the temperature of the wafer W.

Referring again to FIG. 1, the second load-lock module 49 has a box-shaped transfer chamber (chamber) 70 having the second transfer arm 37 incorporated therein. The interior of the loader module 13 is maintained at atmospheric pressure, while the interior of the second process module 34 and the interior of the third process module 36 are maintained under vacuum or at atmospheric pressure or lower. For this reason, the second load-lock module 49 has a vacuum gate valve 54 at a link to the third process module 36, and an atmospheric door valve 55 at a link to the loader module 13, so that the second load-lock module 49 functions as a vacuum preliminary transfer chamber capable of controlling the internal pressure thereof.

Meanwhile, the inventors of the present invention found that, when the above described chemical reaction process using hydrogen fluoride gas is carried out using a conventional chemical reaction processing apparatus, i.e. a chemical reaction processing apparatus having gas supply holes with a diameter of 0.3 to 0.8 mm, ring-shaped white deposit around each gas supply hole becomes attached to a part of each gas supply hole in the vicinity of an opening thereof leading into a processing chamber. The inventors of the present invention then inferred that liquefaction of the hydrogen fluoride gas relates to the attachment of the deposit based on the findings that the hydrogen fluoride gas lies in a high polymer state in which the molecular weight is approximately 70 due to clustering of hydrogen fluoride molecules, i.e. chain combination of the hydrogen fluoride molecules when the hydrogen fluoride gas is supplied at atmospheric pressure (760 mmHg) and at room temperature (20° C.), and when the hydrogen fluoride gas is discharged in a stroke from a high-pressure area to a low-pressure area, the temperature of the hydrogen fluoride gas suddenly decreases due to dissociation of the clustered hydrogen fluoride molecules as well as adiabatic expansion.

Figure 4:
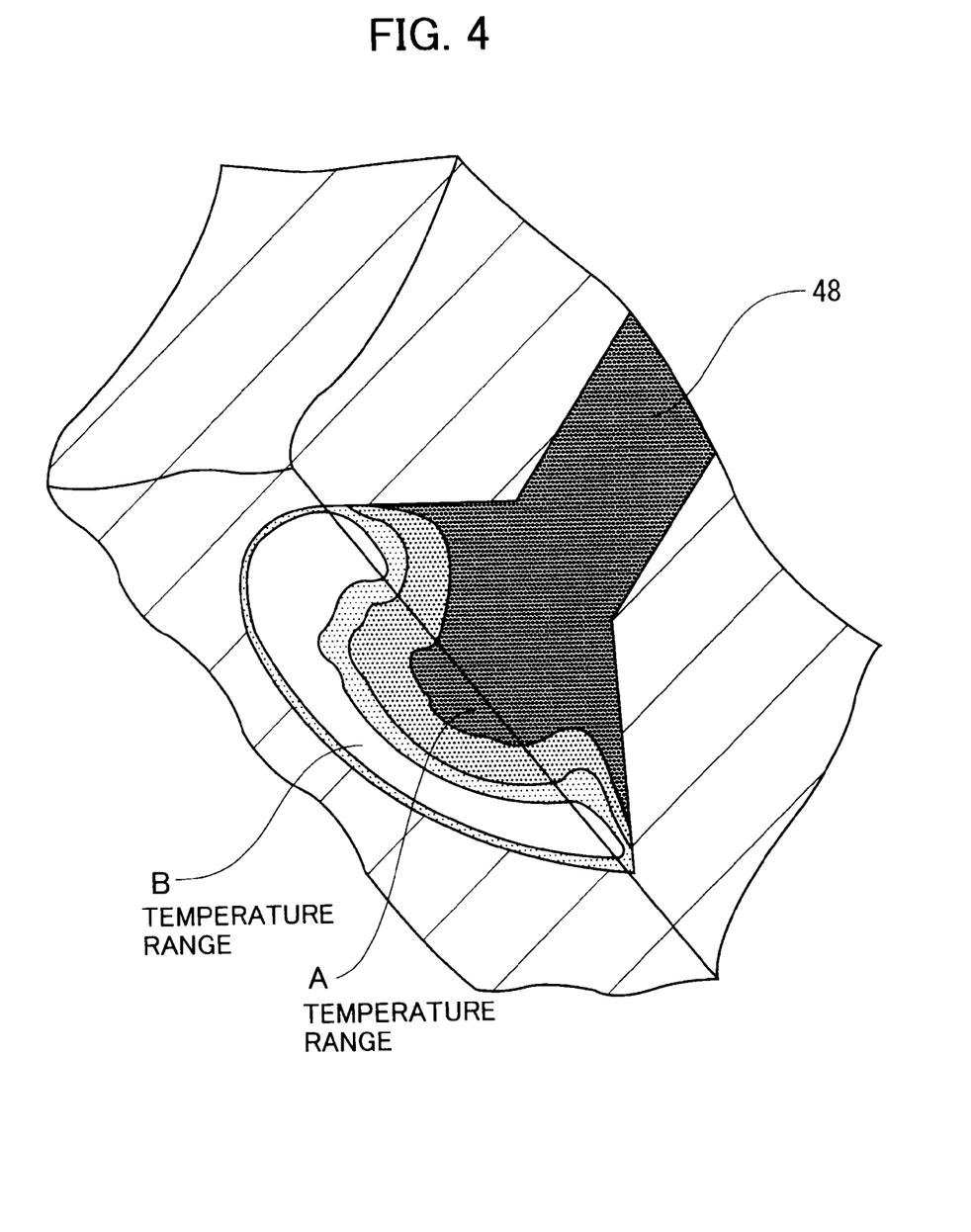
FIG. 4 is a view showing a temperature distribution of hydrogen fluoride gas in the vicinity of an opening of a gas supply hole leading into a chamber.

Accordingly, through numerical simulations, the inventors of the present invention computed the temperature distribution of hydrogen fluoride gas inside the gas supply holes when the hydrogen fluoride gas passes through the gas supply holes. FIG. 4 shows the temperature distribution of hydrogen fluoride gas in the vicinity of the openings of each gas supply hole 48 leading into the chamber 38. From the temperature distribution in FIG. 4, the inventors of the present invention then found that the temperature of hydrogen fluoride gas suddenly decreases from the center of each gas hole 48 toward the outside in the opening of the gas supply hole 48 leading into the chamber 38. That is, the inventors of the present invention found that there is a large difference in temperature between a temperature range A and a temperature range B. In view of the foregoing, the inventors of the present invention found that the attachment of the deposit is caused by liquefaction of hydrogen fluoride gas whose temperature has decreased.

Then, the inventors of the present invention computed temperature distributions through the above numerical simulations with respect to each of models in which the diameter of each gas supply hole is 1 mm (model 1), the diameter of each gas supply hole is 1.5 mm (model 2), and the diameter of each gas supply hole is 2 mm (model 3). The inventors of the present invention then computed a temperature difference ($\Delta T$) between the temperature in the temperature range A and the temperature in the temperature range B (see Table 1). The inventors of the present invention also computed the maximum flow velocity (m/sec) of hydrogen fluoride passing through each gas supply hole and a pressure difference (Pa) in each of the models through numerical simulations.

TABLE 1

|  | Hole diameter (mm) | Temperature difference ($\Delta T$) (deg C.) | Maximum flow velocity (m/sec) | Pressure difference (Pa) |
| --- | --- | --- | --- | --- |
| Model 1 | 1 | −53 | 1.380 | 6.834 |
| Model 2 | 1.5 | −29 | 0.633 | 2.343 |
| Model 3 | 2 | 0 | 0.352 | 0.919 |

In the above numerical simulations, the flow rate of hydrogen fluoride gas was set to 2970 to 3030 sccm, the pressure in the processing chamber was set to 4000 Pa (30 Torr) or higher, and the temperature on the side wall of each gas supply hole was set to 80° C. or higher. Also, the diameter of each gas supply hole was set to 10 mm in the model 1; 15 mm, the model 2; and 20 mm, the model 3.

In conventional chemical reaction processing apparatuses, the temperature of hydrogen fluoride gas to be supplied cannot be heated to 40 to 50° C. or higher. For this reason, in the conventional chemical reaction processing apparatuses, the temperature of hydrogen fluoride gas becomes lower than a boiling point in the vicinity of openings of gas supply holes leading into a processing chamber when the hydrogen fluoride gas passes through the gas supply holes, and the hydrogen fluoride gas liquefies in the vicinity of the openings.

Figure 5:
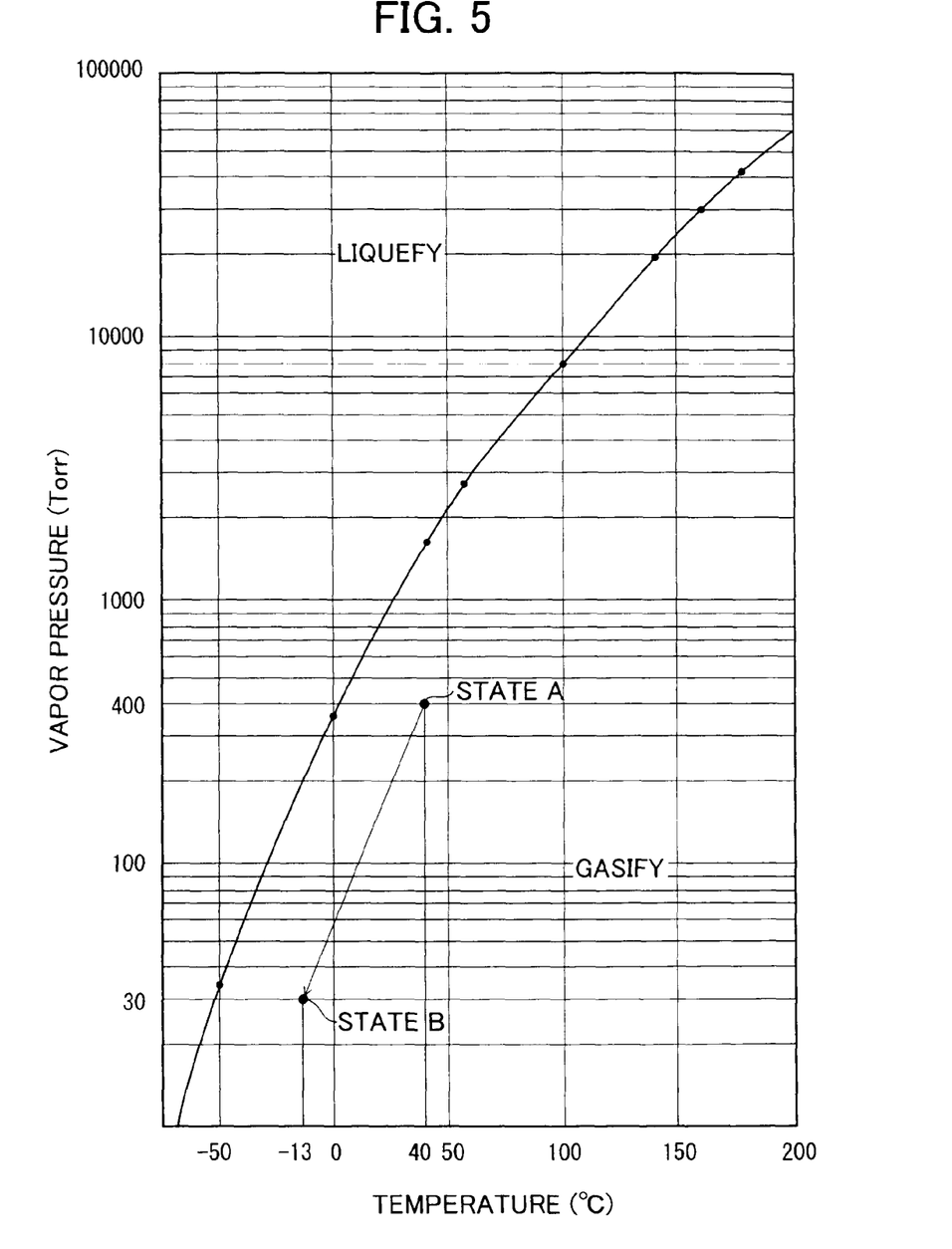
FIG. 5 is a graph showing vapor pressure curves of hydrogen fluoride.

On the other hand, in the second process module 34 as a chemical reaction processing apparatus, the diameter $L_1$ of each gas supply holes 48 is set to 1 mm or greater, preferably 1 mm, and the length $L_2$ of each gas supply the hole 48 is set to 10 mm, as described above. Moreover, the flow rate of hydrogen fluoride gas is set to 2970 to 3030 sccm, the pressure in the chamber 38 is set to 4000 Pa (30 Torr) or higher, and the temperature on the wall of each gas supply hole 48 is set to 80° C. or higher. Thus, based on the calculation results of the above numerical simulations (see Table 1), the temperature of hydrogen fluoride gas decreases by up to 53° C. in the vicinity of the openings of the gas supply holes 48 leading into the chamber 38 when the hydrogen fluoride gas passes through the gas supply holes 48. Based on a graph of FIG. 5 showing vapor pressure curves of hydrogen fluoride, when hydrogen fluoride gas supplied at a pressure of 400 Torr and at a temperature of 40° C. (state A) is supplied into the chamber 38 whose internal pressure is 4000 Pa (30 Torr), the hydrogen fluoride gas is maintained in gaseous form even if the temperature of the hydrogen fluoride gas decreases by up to 53° C. (state B). Thus, when hydrogen fluoride gas passes through the gas supply holes 48, the temperature of the hydrogen fluoride gas never becomes lower than the boiling point in the vicinity of the openings of the gas supply holes 48 leading into the chamber 38, and hence the hydrogen fluoride gas never liquefies in the vicinity of the openings. Therefore, the attachment of deposit caused by liquefaction of hydrogen fluoride in the vicinity of the openings can be prevented, and hence the discharge of hydrogen fluoride gas is never obstructed. As a result, hydrogen fluoride gas can be discharged uniformly toward a wafer. Further, because there is no deposit in the vicinity of the openings, the attachment of deposit caused to fall off due to discharge of hydrogen fluoride gas to the surface of a wafer never occurs.

It should be noted that as described above, the diameter of each gas supply hole 48 is preferably set to 1 mm or greater so as to prevent liquefaction of hydrogen fluoride gas in the vicinity of the openings of the gas supply holes 48 leading into the chamber 38. However, the gas supply holes 48 are configured as discharge holes through which hydrogen fluoride gas is uniformly discharged toward a wafer by the GDP 40, hydrogen fluoride gas has to pass through the gas supply holes 48 with a large pressure difference and at a high flow velocity so as to uniformly discharge hydrogen fluoride gas toward a wafer at a low flow rate. Accordingly, in the present embodiment, it is preferred that the diameter $L_1$ of each gas supply hole 48 is set to 1 mm based on the calculation results of the above numeric simulations (see Table 1). It should be noted that even in the case where the diameter $L_1$ of each gas supply hole 48 is set to 1 mm or greater, discharging hydrogen fluoride gas at a high flow rate makes it possible to discharge hydrogen fluoride gas uniformly toward a wafer.

The gas supply holes in the present embodiment should not necessarily be applied to the process module that carries out the above described chemical reaction processing, but may be applied to other modules. Also, a processing gas supplied through the gas supply holes in the present embodiment should not necessarily be hydrogen fluoride gas, but may be gas of which molecules are turned into clusters.

In the present embodiment, the chemical reaction process on a wafer W and the heating process on the wafer W are carried out by the respective different process modules, but may be carried out by one process module.

Moreover, although in the above description, the substrate processing system including the substrate processing apparatus according to the present embodiment is constructed such that the two process ships are disposed parallel, the construction of the substrate processing system is not limited to this. Specifically, a plurality of process modules may be disposed in tandem, or in a cluster.

Furthermore, substrates on which the chemical reaction process and the heating process are carried out are not limited to semiconductor device wafers, but may instead be various substrates used in LCDs (Liquid Crystal Displays), FPDs (Flat Panel Displays) or the like, photomasks, CD substrates, printed substrates, or the like.

What is claimed is:

1. A substrate processing apparatus comprising: a hydrogen fluoride gas supply unit which provides hydrogen fluoride gas at a predetermined temperature as a processing gas into a processing chamber; a pressure-reducing and heating unit connected to the hydrogen fluoride gas supply unit, configured to decrease a pressure of the hydrogen fluoride gas, and configured to heat the hydrogen fluoride gas after adiabatic expansion to maintain the hydrogen fluoride gas at the predetermined temperature; and a hydrogen fluoride gas supply pipe connected between the pressure-reducing and heating unit and the processing chamber; wherein said hydrogen fluoride gas supply unit comprises a plurality of gas supply holes for introduction of the hydrogen fluoride gas into the processing chamber, each of said gas supply holes is configured to uniformly supply the hydrogen fluoride gas into the processing chamber and prevent liquefaction of the hydrogen fluoride gas when supplied into the processing chamber, said pressure-reducing and heating unit is disposed on-a upstream from the hydrogen fluoride gas supply pipe through which the hydrogen fluoride gas passes before supplying the processing gas into the processing chamber and performs both a reduction of a pressure of the hydrogen fluoride gas and a heating of the hydrogen fluoride gas such that clusters of molecules of the hydrogen fluoride gas are dissociated before supplying the hydrogen fluoride gas into the processing chamber, wherein said pressure-reducing and heating unit reduces the pressure of the hydrogen fluoride gas from more than atmospheric pressure to less than atmospheric pressure.

2. A substrate processing apparatus according to claim 1, wherein in a case where a flow rate of the processing gas supplied into the processing chamber by said hydrogen fluoride gas supply unit is 2970 to 3030 sccm, said gas supply holes are formed to have a diameter of 1 mm or greater.

3. A substrate processing apparatus according to claim 2, wherein a pressure in the processing chamber is 4000 Pa (30 Ton) or higher, and a temperature on walls of said gas supply holes is 80 ° C. or higher.

4. A substrate processing apparatus according to claim 1, wherein each of said gas supply holes has an opening leading into the processing chamber and broadening toward the end.

5. A substrate processing apparatus according to claim 1, wherein said pressure-reducing and heating unit reduces the pressure of the hydrogen fluoride gas from 1000 Ton to 400 Torr.

6. A substrate processing apparatus according to claim 1, wherein the hydrogen fluoride gas the pressure of which has been reduced is supplied into the processing chamber from a high-pressure area higher in pressure than the pressure in the processing chamber.

* * * * *